US012648404B2

(12) United States Patent (10) Patent No.: US 12,648,404 B2
Yoshioka et al. (45) Date of Patent: Jun. 2, 2026

(54) SEMICONDUCTOR WAFER PROCESSING METHOD

(71) Applicant: HITACHI HIGH-TECH CORPORATION, Tokyo (JP)

(72) Inventors: Nozomu Yoshioka, Tokyo (JP); Kazumasa Okuma, Tokyo (JP); Kenichi Kuwahara, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 280 days.

(21) Appl. No.: 18/280,569

(22) PCT Filed: Aug. 3, 2022

(86) PCT No.: PCT/JP2022/029761
§ 371 (c)(1),
(2) Date: Sep. 6, 2023

(87) PCT Pub. No.: WO2024/029000
PCT Pub. Date: Feb. 8, 2024

(65) Prior Publication Data
US 2025/0038033 A1 Jan. 30, 2025

(51) Int. Cl.
*H10P 72/72* (2026.01)
*H01J 37/32* (2006.01)
*H10P 50/24* (2026.01)

(52) U.S. Cl.
CPC ...... *H10P 72/722* (2026.01); *H01J 37/32715* (2013.01); *H10P 50/242* (2026.01);
(Continued)

(58) Field of Classification Search
CPC . H01L 21/6833; H01L 21/3065; H01L 21/67; H01L 21/683; H01L 21/6831;
(Continued)

(56) References Cited

U.S. PATENT DOCUMENTS

2018/0040491 A1* 2/2018 Ishiguro ............. H01J 37/3299
2020/0328064 A1 10/2020 Bin Budiman et al.
(Continued)

FOREIGN PATENT DOCUMENTS

JP 2002-217166 A 8/2002
JP 2002-222799 A 8/2002
(Continued)

OTHER PUBLICATIONS

JP 2022-024265 A, English-language translation "Substrate Detachment Method and Plasma Processing Device" (Year: 2022).*
(Continued)

*Primary Examiner* — Anita K Alanko
(74) *Attorney, Agent, or Firm* — Miles & Stockbridge, P.C.

(57) ABSTRACT

An object of the invention is to provide a wafer processing method capable of preventing a positional deviation of a wafer in wafer processing. The wafer processing method according to the invention includes: in a processing apparatus including a sample stage including an electrode configured to electrostatically adsorb a wafer, a waferless electricity-removal step of removing an electric charge charged on the sample stage without placing a wafer on the sample stage; and a wafer processing step of electrostatically adsorbing the wafer placed on the sample stage and processing the wafer after the waferless electricity-removal step. The waferless electricity-removal step includes: a plasma generation step of generating a plasma by using a first electricity-removal gas; and a power supplying step of supplying first power to the electrode of the sample stage.

5 Claims, 9 Drawing Sheets

(52) U.S. Cl.
    CPC .................. *H01J 2237/0041* (2013.01); *H01J 2237/2007* (2013.01); *H01J 2237/334* (2013.01)

(58) Field of Classification Search
    CPC .......... H01L 21/67069; H01J 37/32715; H01J 2237/0041; H01J 2237/2007; H01J 2237/334; H01J 37/32; H01J 37/321; H01J 37/32174; H01J 37/32697; H01P 72/00; H01P 72/70; H01P 72/722; H01P 72/72; H01P 72/0421; H01P 50/242
    See application file for complete search history.

(56) References Cited

U.S. PATENT DOCUMENTS

| 2020/0343124 A1* | 10/2020 | Arakane | ........... | H01J 37/32091 |
| 2025/0218745 A1* | 7/2025 | Park | .................. | H01J 37/32422 |

FOREIGN PATENT DOCUMENTS

| JP | 2017-216346 A | 12/2017 |
| JP | 2020-177959 A | 10/2020 |
| JP | 2022-024265 A | 2/2022 |
| KR | 10-2022-0008223 A | 1/2022 |

OTHER PUBLICATIONS

JP 2002-222799, English language translation "Plasma Processing Apparatus and Cleaning Method Thereof, and Method for Discharging Charge From Electrostatic Chuck" (Year: 2002).*

Search Report mailed Sep. 20, 2022 in International Application No. PCT/JP2022/029761.

Written Opinion mailed Sep. 20, 2022 in International Application No. PCT/JP2022/029761.

Office Action mailed Nov. 18, 2024 in Korean Application No. 10-2023-7030055.

* cited by examiner

[FIG. 1]
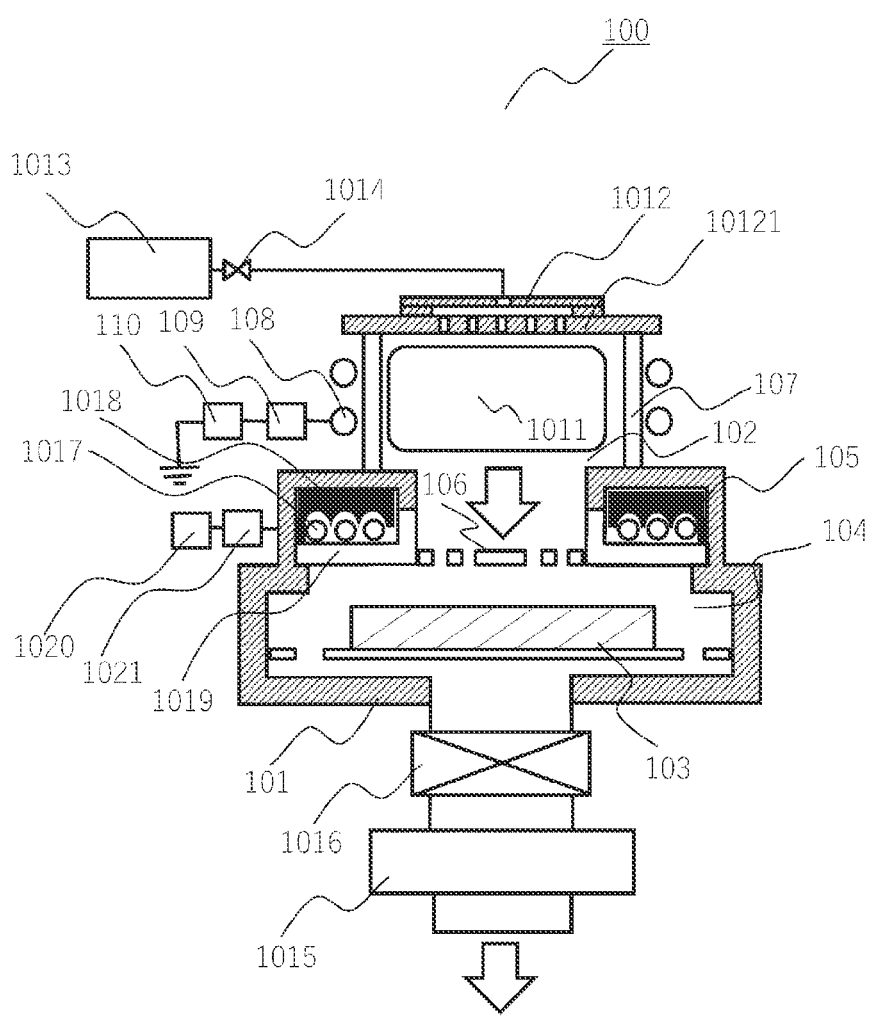

[FIG. 2]
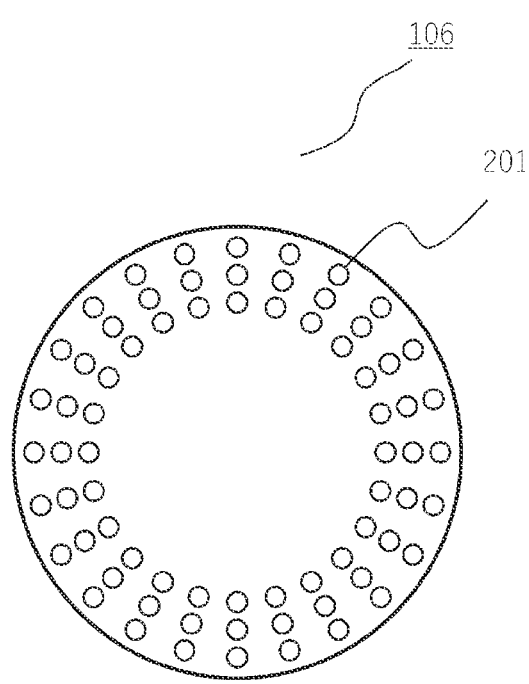

[FIG. 3]
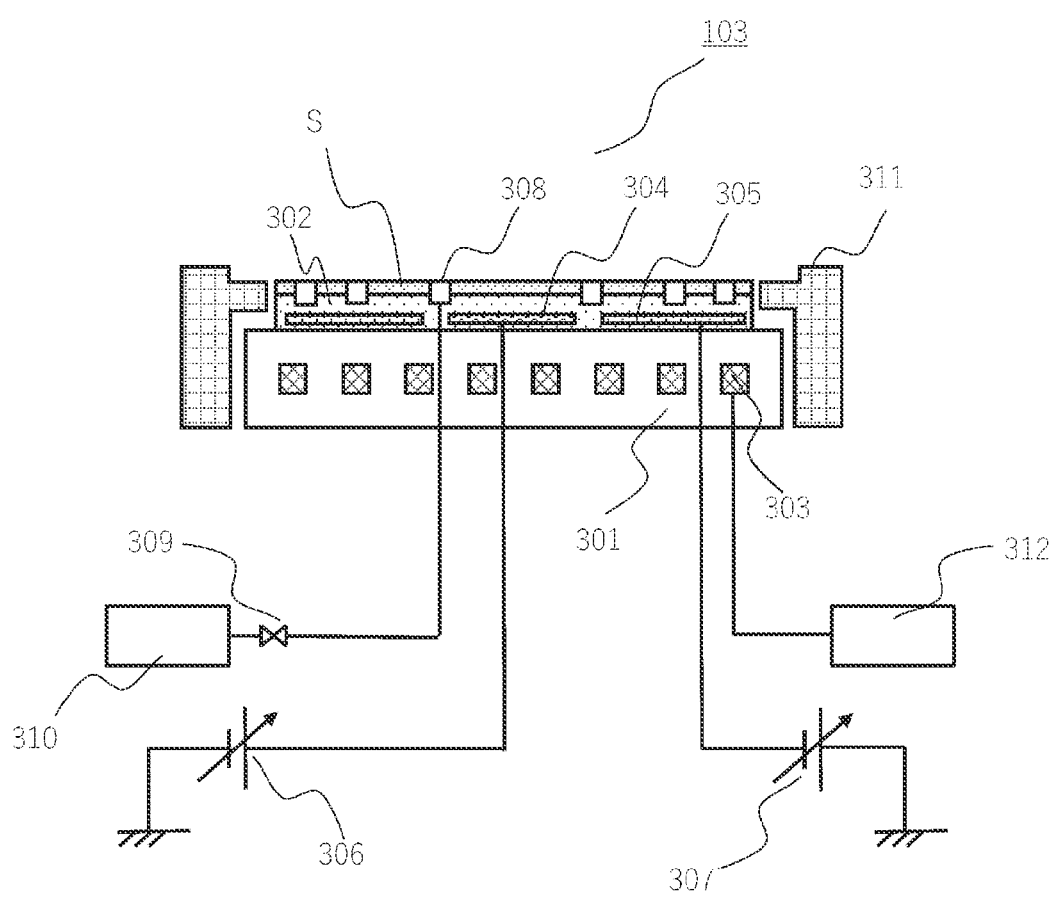

[FIG. 4]
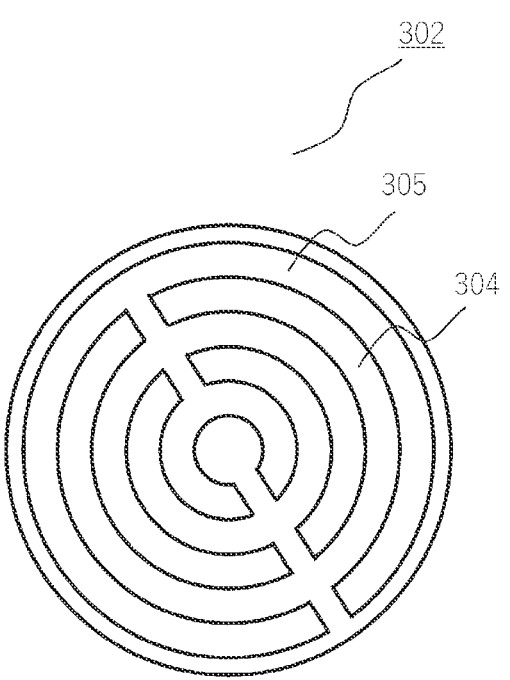

[FIG. 5]
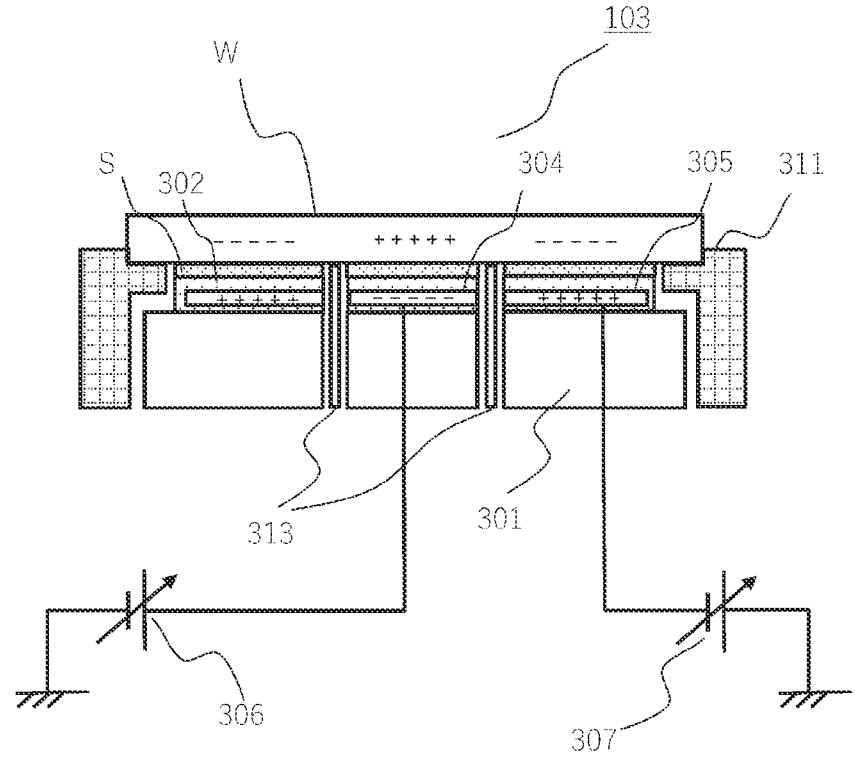

[FIG. 6]
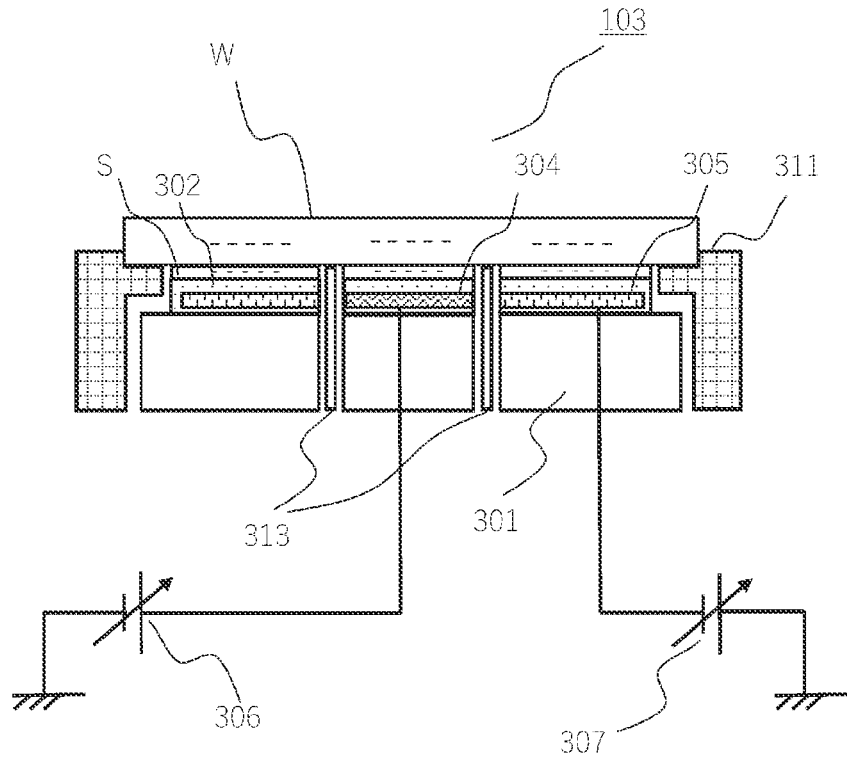

[FIG. 7]
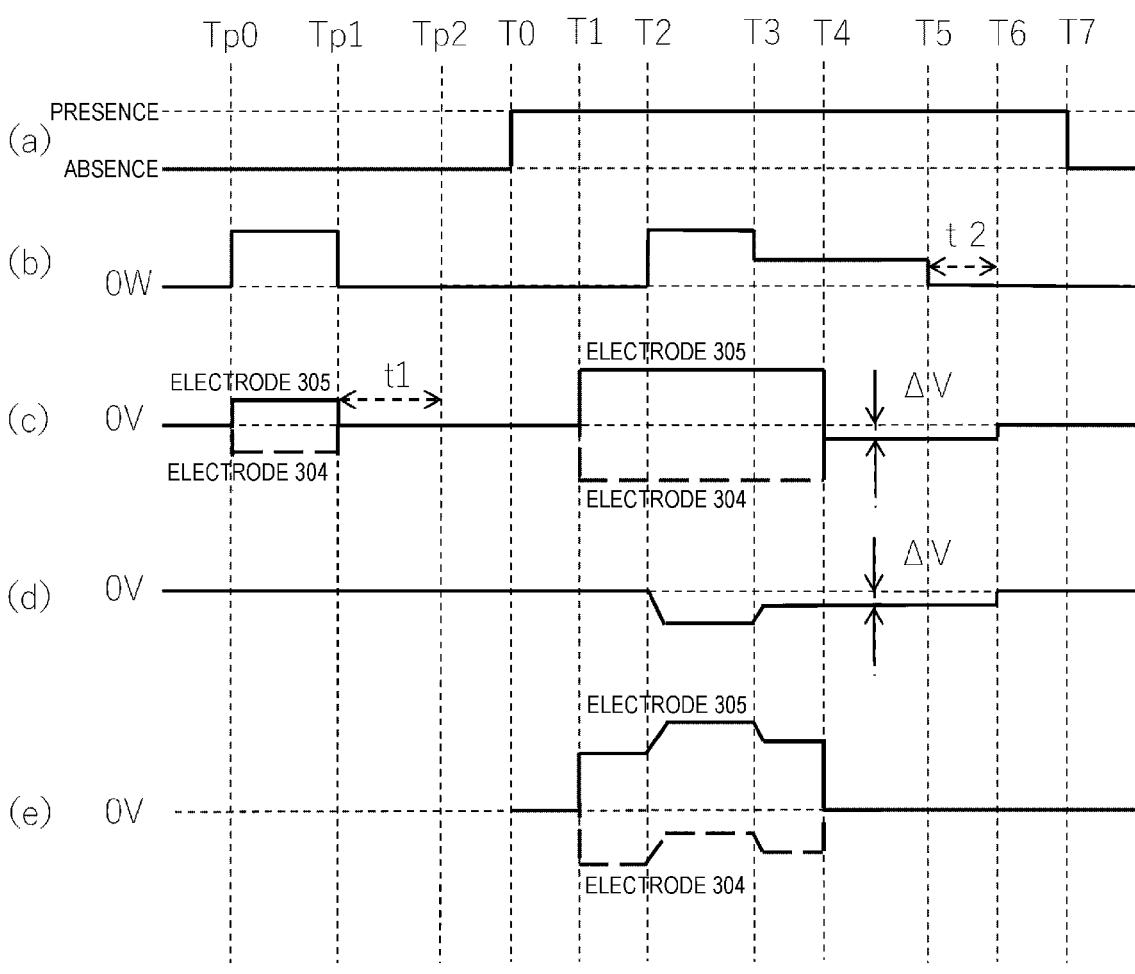

[FIG. 8]
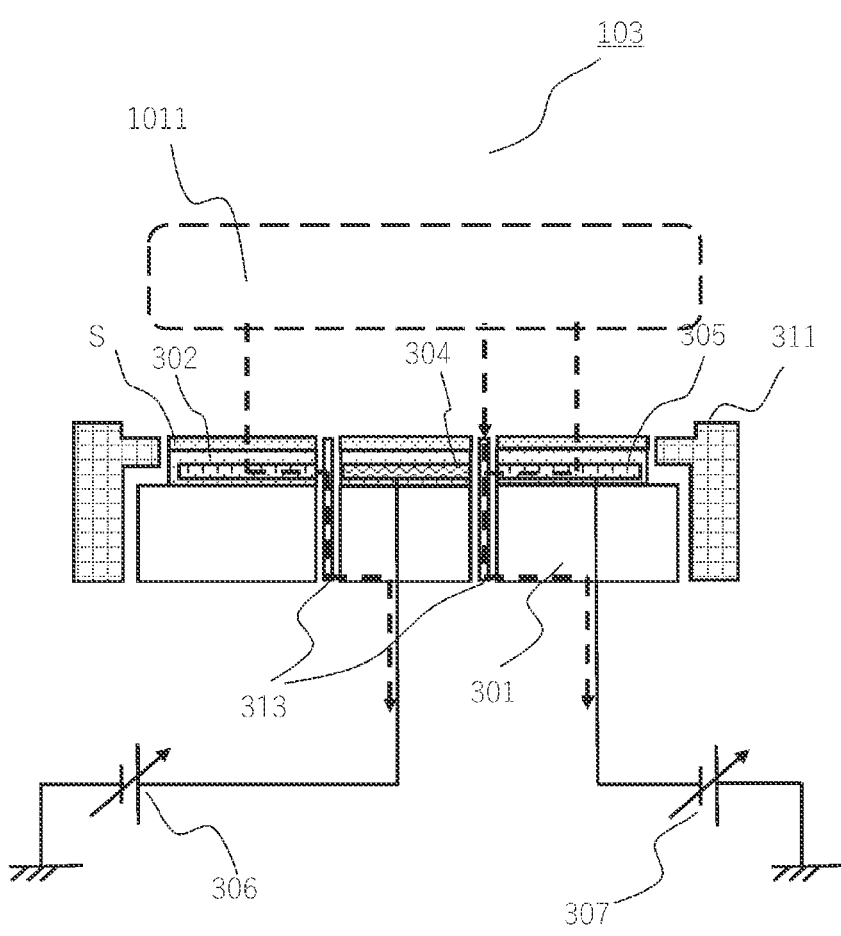

[FIG. 9]
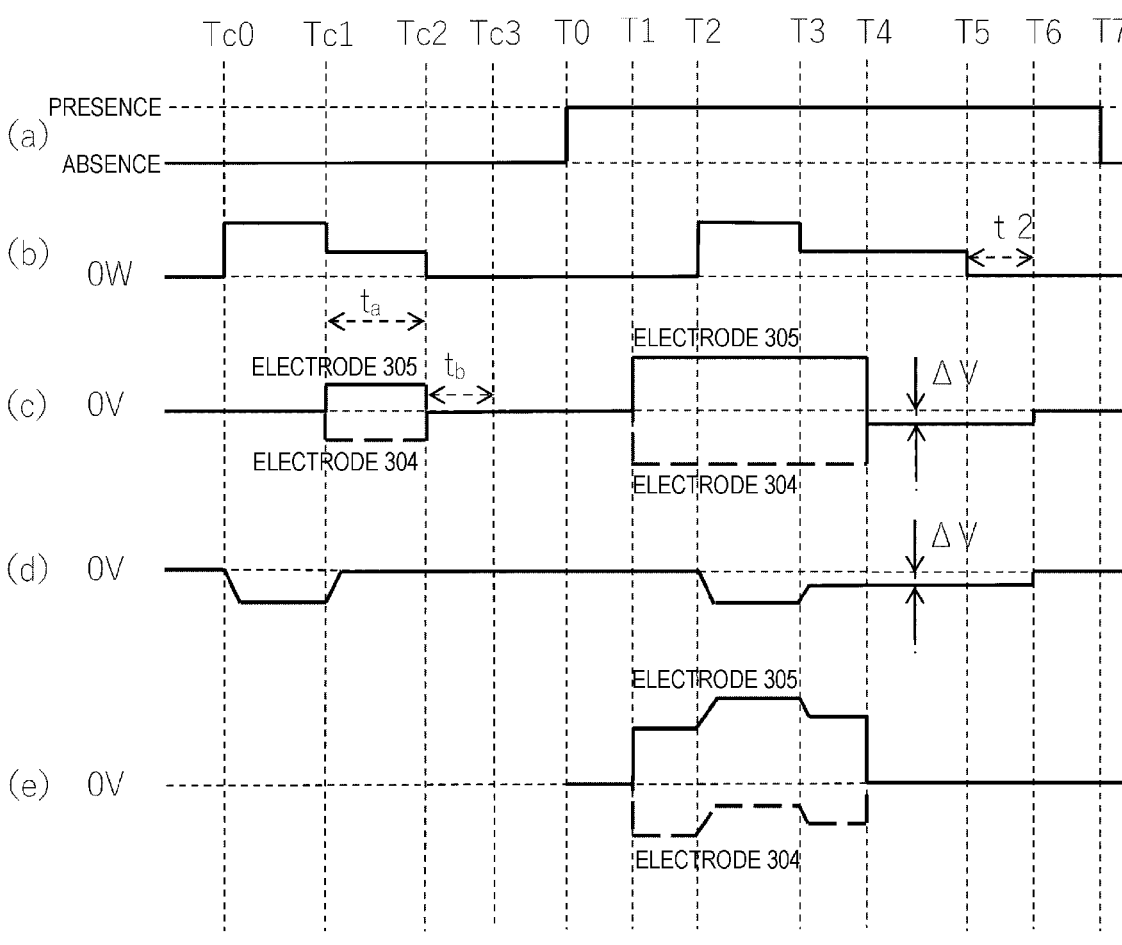

SEMICONDUCTOR WAFER PROCESSING METHOD

TECHNICAL FIELD

The present invention relates to a wafer processing method.

BACKGROUND ART

In recent years, low power consumption and storage capacity increase are required in the market of semiconductor devices. In order to implement the requirements, development of semiconductor devices having a three-dimensional structure has attracted attention. The methods for processing the three-dimensional structure include plasma etching, in which anisotropic or isotropic etching can be selected depending on the usages.

In a process of etching by using a plasma, a reaction product is generated, for example, between a workpiece material and radicals. It is known that adhesion or deposition of the reaction product in a processing chamber causes various problems in an etching performance of a plasma processing apparatus.

As a countermeasure against the problems, it has been proposed to remove the reaction product by periodic cleaning processing. JP2002-217166A (PTL 1) discloses a plasma cleaning method of removing deposits in a vacuum container by plasma processing and a gas cleaning method of performing cleaning by gas introduction without using a plasma. In the cleaning, to protect an electrostatic adsorption surface and an electrode from the gas and the plasma, the cleaning is performed in a state where a dummy wafer is placed on a sample stage.

In addition, as a cleaning method for the inside of a vacuum container and particularly the periphery of a sample stage, JP2020-177959A (PTL 2) discloses a cleaning method in a waferless state in which the dummy wafer is not placed. In the method, plasma cleaning is performed by using a plasma generated by $O_2$ gas without placing the dummy wafer on the sample stage.

CITATION LIST

Patent Literature

PTL 1: JP2002-217166A
PTL 2: JP2020-177959A

SUMMARY OF INVENTION

Technical Problem

In PTL 1, the dummy wafer is placed to protect a lower electrode, and an influence of charged particles remaining on the sample stage including the lower electrode is not considered. Further, when cleaning processing is performed in a processing chamber by forming the plasma in a waferless state as disclosed in PTL 2, charged particles such as ions generated by the plasmas adhere to the sample stage.

In this way, in the related art, neither gives sufficient consideration to a case where the charged particles remain on the sample stage.

When a wafer is placed in a state where the charged particles remain on the sample stage, a force caused by electric charges acts on the wafer, and a positional deviation may occur in which the wafer is displaced from an initiallyplaced position. The positional deviation of the wafer is one of factors impairing efficiency and yield in manufacturing the semiconductor device.

An object of the invention is to provide a wafer processing method capable of preventing a positional deviation of a wafer in wafer processing.

Solution to Problem

To solve the technical problem described above, a wafer processing method according to the invention includes: in a processing apparatus including a sample stage including an electrode configured to electrostatically adsorb a wafer, a waferless electricity-removal step of removing an electric charge charged on the sample stage without placing a wafer on the sample stage; and a wafer processing step of electrostatically adsorbing the wafer placed on the sample stage and processing the wafer after the waferless electricity-removal step.

Advantageous Effects of Invention

According to the invention, a wafer processing method capable of preventing a positional deviation of a wafer in wafer processing can be provided.

BRIEF DESCRIPTION OF DRAWINGS

FIG. 1 is a longitudinal sectional view showing a configuration of a plasma processing apparatus that performs a plasma processing method according to an embodiment of the invention.

FIG. 2 is a plan view schematically showing a dispersion plate according to the embodiment.

FIG. 3 is a longitudinal sectional view schematically showing a configuration of a sample stage according to the embodiment.

FIG. 4 is a plan view schematically showing a configuration of an electrostatic adsorption film 302 according to the embodiment.

FIG. 5 is a longitudinal sectional view schematically showing a state in which a wafer is electrostatically adsorbed in the embodiment.

FIG. 6 is a view showing a case where a positional deviation occurs in the related art.

FIG. 7 is a time chart showing a wafer processing method according to the embodiment.

FIG. 8 is a view showing an electric circuit from a plasma to earth.

FIG. 9 is a timing chart showing a plasma processing method according to a modification of the embodiment.

DESCRIPTION OF EMBODIMENTS

Hereinafter, an embodiment according to the invention will be described with reference to the drawings.

The invention is not limited to the embodiment. Further, in description of the drawings, the same parts are designated by the same reference numerals.

When there are a plurality of components having the same or similar functions, different subscripts may be added to the same reference numeral to perform the description. Further, when there is no need to distinguish the plurality of components, the subscripts may be omitted to perform the description.

To facilitate understanding of the invention, a position, a size, a shape, a range, or the like of each component shown in the drawings may not represent an actual position, size, shape, range, or the like. Therefore, the invention is not necessarily limited to the position, the size, the shape, the range, or the like disclosed in the drawings.

In the present disclosure, the term "upper surface" refers to a surface shown in an upper part of the drawing when a plate-shaped member or a cross section included in the plate-shaped member is shown. The term "side surface" means a portion having a thickness of a surface or a layer in the plate-shaped member or the cross section included in the plate-shaped member.

Further, in a case of a disk-shaped or cylindrical object, the term "central axis" means an axis passing through a center of a circular surface and extending in a direction perpendicular to the surface.

Embodiment (Configuration of Apparatus)

A configuration of a plasma processing apparatus that performs a plasma processing method according to an embodiment of the invention will be described with reference to FIG. 1. FIG. 1 is a longitudinal sectional view showing the configuration of the plasma processing apparatus that performs the plasma processing method according to the embodiment of the invention.

A plasma processing apparatus 100 according to the embodiment includes a vacuum container 101. A processing chamber 104 that is a cylindrical space is provided inside the vacuum container 101. The vacuum container 101 is connected to a vacuum pump 1015 such as a turbo molecular pump via a pressure control valve 1016. The vacuum pump 1015 discharges particles in the processing chamber 104 to set a pressure in the processing chamber 104 to a predetermined pressure. The pressure control valve 1016 has a function of changing a cross-sectional area of a passage connecting the vacuum pump 1015 and the processing chamber 104 and adjusting a flow rate or a speed of the discharging.

The vacuum container 101 includes a discharge chamber 102 upstream of the processing chamber 104. The processing chamber 104 is connected, via a dispersion plate 106, to the discharge chamber 102 in which a plasma is generated. The discharge chamber 102 and the processing chamber 104 are spaces each having a cylindrical shape. A central axis of the discharge chamber 102 and a central axis of the processing chamber 104 are a common axis or located at positions close to each other to be regarded as a common axis.

The dispersion plate 106 is provided between the discharge chamber 102 and the processing chamber 104 and separates the discharge chamber 102 and the processing chamber 104. Specifically, the dispersion plate 106 is disposed in a passage connecting the discharge chamber 102 and the processing chamber 104. In the embodiment, the passage between the discharge chamber 102 and the processing chamber 104 has a cylindrical shape, and the dispersion plate 106 is a disk-shaped and plate-shaped member having the same diameter as the passage. Details of the dispersion plate 106 will be described later.

A wafer that is a processing target is placed on a sample stage 103. In the embodiment, the sample stage 103 is disposed at a position facing the dispersion plate 106. Details of the sample stage 103 will be described later.

The discharge chamber 102 is a space inside a dielectric chamber 107 formed of a dielectric (quartz in the embodiment). A coil 108 is disposed on an outer peripheral sidewall of the dielectric chamber 107 to surround the dielectric chamber 107. The coil 108 is electrically connected to a high-frequency power supply 110 via a matching device 109, and high-frequency power is supplied from the high-frequency power supply 110. Power in a frequency band of several tens of MHz such as 13.56 MHz is used as the high-frequency power.

A top plate 1012 and a gas dispersion plate 10121 are disposed on an upper end portion of the dielectric chamber 107. The top plate 1012 and the gas dispersion plate 10121 partition the dielectric chamber 107 into an inside and an outside. A passage extending from a gas source 1013 is connected to the top plate 1012. Gas supplied from the gas source 1013 is introduced into the discharge chamber 102 through the gas dispersion plate 10121.

The gas source 1013 includes a reservoir for each type of gas to be supplied. A mass flow controller 1014 provided between the gas source 1013 and the top plate 1012 adjusts a supply amount of the gas to be introduced into the discharge chamber 102. The gas for processing used in the embodiment is a combustible gas, a combustion-supporting gas, and a mixed gas thereof, or a gas obtained by diluting the gas with an inert gas.

An IR lamp unit 105 is disposed to surround periphery of the passage connecting the discharge chamber 102 and the processing chamber 104 or periphery of the dispersion plate 106. The IR lamp unit 105 heats the sample stage 103 or the wafer placed thereon, an inside of the processing chamber 104 and the like by emitting an electromagnetic wave. In the embodiment, the IR lamp unit 105 includes an IR lamp 1017 that emits an electromagnetic wave including an infrared ray (infra-red: IR) band. In addition to the IR lamp 1017, the IR lamp unit 105 includes a reflection plate 1018 that reflects an IR light emitted from the IR lamp 1017 toward a direction of the processing chamber 104, and further an IR light transmission window 1019 that transmits the IR light emitted from the IR lamp 1017 toward the direction of the processing chamber 104 or the dispersion plate 106.

In the plasma processing apparatus 100, wafer processing is performed on the wafer placed on the sample stage 103. In the wafer processing, first, the gas is introduced into the discharge chamber 102. Next, an induction magnetic field is formed at a center of the coil 108 by supplying the high-frequency power to the coil 108. When the induction magnetic field is generated, particles of the gas in the discharge chamber 102 are excited to cause discharge, and the particles are ionized and dissociated to generate an inductively coupled plasma (ICP) 1011. While heating by the IR lamp unit 105 or temperature adjustment in the sample stage 103 to be described later is performed, processing such as etching is performed by the generated plasma 1011. In the embodiment, an etching plasma, an electricity-removal plasma, and a cleaning plasma are generated according to the used gas and the high-frequency power.

(Configuration of Dispersion Plate)

Here, a configuration of the dispersion plate 106 will be described with reference to FIG. 2. FIG. 2 is a plan view schematically showing the dispersion plate 106 according to the embodiment. The dispersion plate 106 shown in FIG. 1 is a cross-sectional view, and the dispersion version 106 shown in FIG. 2 is a view seen from above in FIG. 1.

As shown in FIG. 2, the dispersion plate 106 is a plate-shaped member having a circular shape. The dispersion plate 106 has a plurality of through holes 201 through which charged particles can move from the discharge chamber 102 to the processing chamber 104. Each of the plurality of through holes 201 is a circular hole. When a radial direction from a center of the dispersion plate 106 is considered, three circular holes are disposed from a position exceeding a predetermined radius. Three holes are similarly disposed at each of positions shifted by 15° in a circumferential direction. In other words, the plurality of through holes 201 are provided in a ring shape on an outer peripheral side of the dispersion plate 106. In the embodiment, the dispersion plate 106 is implemented by a member formed of a dielectric material such as quartz having transparency. A material is not limited to quartz and may be appropriately selected.

Neutral particles such as radicals of the gas contained in the plasma 1011 are uniformly introduced from the discharge chamber 102 into the processing chamber 104 through the plurality of through holes 201. That is, the neutral particles such as radicals are introduced into the processing chamber 104 from a ring-shaped position on the outer peripheral side of the dispersion plate 106 disposed at a position facing the wafer placed on the sample stage 103. The disposition of the plurality of through holes 201 as described above is not limited thereto. The disposition of the through holes may be appropriately selected such that a distribution of the neutral particles such as radicals that are introduced into the processing chamber 104 and reach a surface of the wafer provides a desired processing result of a film layer that is a processing target. The charged particles such as ions and electrons contained in the plasma 1011 are prevented from being introduced from the discharge chamber 102 into the processing chamber 104 by the dispersion plate 106.

(Configuration of Sample Stage)

Next, a configuration of the sample stage 103 and a configuration in which the wafer is electrostatically adsorbed according to the embodiment will be described with reference to FIGS. 3 and 4. FIG. 3 is a longitudinal sectional view schematically showing the configuration of the sample stage 103 according to the embodiment. FIG. 4 is a plan view schematically showing a configuration of an electrostatic adsorption film 302 according to the embodiment.

In the embodiment, in a device including the processing chamber 104 and the sample stage 103 disposed in the processing chamber 104 and including an electrode capable of electrostatically adsorbing a wafer, a wafer W is electrostatically adsorbed and processed. The sample stage 103 shown in FIG. 3 has a cylindrical shape. A central axis of the sample stage 103 and the central axis of the processing chamber 104 are a common axis or located at positions close to each other to be regarded as a common axis. The sample stage 103 includes a base material 301 formed of a conductor such as a metal, the electrostatic adsorption film 302 disposed on the base material 301, and a susceptor ring 311 disposed to surround side surfaces of the base material 301 and the electrostatic adsorption film 302. The wafer placed on the sample stage 103 is placed on the electrostatic adsorption film 302. The electrostatic adsorption film 302 comes into contact with the wafer and grips the wafer by the electrostatic adsorption. The electrostatic adsorption film 302 includes a sheet S formed of a polyimide resin. The sheet S formed of the polyimide resin is provided on a surface of the electrostatic adsorption film 302. The susceptor ring 311 is implemented by a dielectric and has a function of protecting the base material 301 from the plasma 1011. The susceptor ring 311 according to the embodiment has a shape that surrounds a side wall of the electrostatic adsorption film 302 on the base material 301 and covers from a side wall of the base material 301 to a lower portion of the base material 301.

A coolant flow path 303 is disposed inside the base material 301. A coolant is supplied from a chiller 312 to the coolant flow path 303, and the supplied coolant circulates through the coolant flow path 303. The chiller 312 is disposed in a space below a floor surface of a building such as a clean room in which the plasma processing apparatus 100 is disposed, and is connected to the coolant flow path 303. A temperature of the wafer placed on the sample stage 103 is adjusted to a desired temperature suitable for the wafer processing by exchanging heat with the coolant flowing through the coolant flow path 303 via the electrostatic adsorption film 302 and the base material 301. As a shape of the coolant flow path 303, for example, the coolant flow path 303 may be disposed concentrically or spirally with respect to a central axis that is an axis perpendicular to a plane direction of the base material 301.

A plurality of grooves 308 are formed in an upper surface of the electrostatic adsorption film 302. Further, a heat transfer gas source 310 supplies a gas having heat transfer such as He gas through a path having a valve 309 to be opened and closed. The gas supplied from the heat transfer gas source 310 diffuses along the grooves 308 and reaches a back surface of the wafer W. The He gas filling the grooves 308 promotes heat transfer between the coolant flowing through the coolant flow path 303 and the wafer W, and a temperature of the wafer W is adjusted efficiently. The surface of the electrostatic adsorption film 302 is implemented by the sheet S formed of the polyimide resin. The sheet S formed of the polyimide resin is a film formed of a resin material containing polyimide. It is generally known that the polyimide resin has a low friction coefficient, wear resistance, and an excellent insulating property. The sheet S formed of the polyimide resin has a function of preventing the back surface of the wafer from being damaged due to expansion or contraction of the wafer even when a temperature change occurs due to heating or cooling in a state where the wafer is electrostatically adsorbed. A material of the sheet S is not limited thereto and may be appropriately selected.

FIG. 4 shows a cross-sectional structure of the electrostatic adsorption film 302 cut in a plane direction. As shown here, a plurality of film-shaped electrodes 304 and 305 are disposed inside the electrostatic adsorption film 302. The electrode 304 is supplied with DC power from a DC power supply 306, and the electrode 305 is supplied with DC power from a DC power supply 307. The electrodes 304 and 305 each include a plurality of arm portions having an arc shape disposed in a multiple concentric manner around the central axis of the sample stage 103 in the plane direction, and have a configuration of a so-called comb tooth disposition in which the arm of one electrode is sandwiched by the arms of the other electrode. Shapes of the electrodes 304 and 305 are not limited thereto. It is sufficient that the electrodes 304 and 305 are disposed to be uniformly distributed in the electrostatic adsorption film 302.

(Electrostatic Adsorption on Sample Stage)

Next, a process of electrostatically adsorbing the wafer on the sample stage 103 will be described with reference to FIG. 5. FIG. 5 is a longitudinal sectional view schematically showing a state where the wafer is electrostatically adsorbed according to the embodiment. The sample stage 103 shown in FIG. 5 is the same as the sample stage 103 shown in FIG. 3. In FIG. 5, to facilitate understanding, elements shown in FIG. 3 are omitted, and elements not shown in FIG. 3 are shown. Further, to facilitate understanding, a size of a configuration is changed.

As shown in FIG. 5, a negative voltage is applied to the electrode 304 from the DC power supply 306, and a positive voltage is applied to the electrode 305 from the DC power supply 307. By applying the voltages having different polarities to the electrode 304 and the electrode 305, a bipolar (dipole) electrode is formed between the electrode 304 and the electrode 305. Positive ions and negative ions in the wafer W approach the electrode 304 having the negative voltage and the electrode 305 having the positive voltage, respectively. Electrostatic forces are generated between the positive ions in the wafer W and the electrode 304 and between the negative ions in the wafer W and the electrode 305, respectively, and the wafer W is adsorbed to the sample stage 103.

In the embodiment, a voltage of −1500 V is applied to the electrode 304 from the DC power supply 306, and a voltage of 1500 V is applied to the other electrode 305 from the DC power supply 307.

Conversely, the voltage of −1500 V may be adjusted to be applied to the electrode 305 from the DC power supply 307 when the voltage of 1500 V is applied to the electrode 304 from the DC power supply 306. In the embodiment, the voltages applied by the DC power supplies 306 and 307 are ±1500 V, are adjusted such that voltages having the same magnitude and different polarities are applied from one DC power supply and the other DC power supply, and are not limited thereto. As long as the wafer W can be adsorbed on the electrostatic adsorption film 302 and occurrence and an amount of a positional deviation can be within an allowable range when the wafer W is held or attached and detached, absolute values of the voltages applied to the electrodes may not be the same even when a voltage exceeding ±1500 V or less is used. Further, the electrodes 304 and 305 may be applied with the same polarity.

The plasma processing apparatus 100 includes a plurality of (for example, three) push-up pins 313 extending from an inside of the sample stage 103 toward an upper surface direction of the sample stage 103 to detach the wafer W from the sample stage 103 after etching the wafer W is completed and the electrostatic adsorption is released. After the electrostatic adsorption of the wafer W is released, the push-up pins 313 accommodated inside the sample stage 103 are moved upward to push up the wafer W, so that the wafer W can be detached from the sample stage 103. The detached wafer W is held by a transfer mechanism such as a robot arm and carried out from the processing chamber 104.

[Reason for Occurrence of Positional Deviation in Related Art]

When plasma processing such as cleaning is performed in a waferless state in which the wafer is not placed on the sample stage 103, it is considered that three events that cause the positional deviation of the wafer occur. The three events will be described with reference to FIG. 6. FIG. 6 is a view showing a case where the positional deviation occurs in the related art.

(Event Caused by Charged Particles)

The first event is caused by the charged particles generated during the processing. When the plasma processing is performed in the waferless state, the electrostatic adsorption film 302 may be damaged due to collision of the charged particles such as ions, or adhesion of a reaction product and the like may occur. To avoid such a problem, in general, power is not supplied to the electrodes 304 and 305 in the electrostatic adsorption film 302 during the waferless plasma processing. In this case, when the charged particles such as ions adhere to the electrostatic adsorption film 302, the charged particles remain as negative electric charges on the surface of the electrostatic adsorption film 302 as shown in FIG. 6 because the power is not supplied from the power supply and there is no other path through which electric charges are likely to flow.

It is assumed that the wafer processing is performed in a state where there are remaining electric charges. When the wafer W is transferred to the processing chamber 104, negative electrification occurs on the wafer W due to friction with the gas existing in the processing chamber, or the electric charges remaining in the processing chamber 104 adhere to the wafer W. When the wafer charged in this way is transferred to the electrostatic adsorption film 302 having the remaining electric charges, the electric charges of the wafer and the electric charges of the electrostatic adsorption film 302 may repel each other, the wafer may be inclined, and the positional deviation of the wafer may occur. Further, when the electrostatic adsorption is performed on the charged wafer, the wafer may be electrostatically adsorbed toward one part thereof. When the wafer is adsorbed toward a portion of an electrode surface, the positional deviation may occur when the wafer is replaced.

In an experiment conducted by the inventors, it was found that a potential of a surface of the electrostatic adsorption film 302 was varied before and after the waferless plasma processing by using the plasma processing apparatus 100 as a result of detecting the potential before and after the processing and during the processing. Based on the finding, as described above, it is assumed that the electric charges exist in the electrostatic adsorption film 302 in a step of the waferless processing using the plasma.

(Event Caused by Dispersion Plate)

The second event is caused by the dispersion plate 106. Description will be made with reference to FIG. 6. The dispersion plate 106 can prevent the charged particles such as ions from moving to the processing chamber 104 at a position where the through holes 201 are not disposed, but a part of the charged particles flow from the discharge chamber 102 into the processing chamber 104 through positions where the through holes 201 are disposed. Due to a distribution property of the through holes, a relatively large amount of the charged particles flowing into the processing chamber 104 adhere to an outer peripheral portion of the surface of the electrostatic adsorption film 302.

When the wafer W is electrostatically adsorbed on the sample stage 103 in a state where the charged particles adhere in this way, single adsorption may occur in which a large electrostatic adsorption force acts locally on a part of the back surface of the wafer W. When the wafer W is subjected to the single adsorption, the electric charges in the electrostatic adsorption film 302 are not sufficiently reduced and the electrostatic force remains even when an electricity-removal step after the plasma processing described in the related art is performed. Therefore, a remaining adsorption force acts on the wafer W, which makes it difficult to detach the wafer W from the sample stage 103, and a large force acts on the wafer W when the wafer W is detached, which may cause damage or positional deviation of the wafer W.

(Event Caused by Sheet Formed of Polyimide Resin)

The third event is caused by the sheet S formed of the polyimide resin. A wafer placement surface of the electrostatic adsorption film 302 is implemented by the sheet S formed of the polyimide resin. A substance having a high insulation property, such as the polyimide resin, is generally known to have a property that it is difficult for electricity to pass through and the charged particles tend to remain.

Therefore, the electric charges are not sufficiently removed only by performing the electricity-removal step described in the related art.

(Wafer Processing)

With reference to FIG. 7, the wafer processing including an electricity-removal step of removing the remaining charged particles will be described. FIG. 7 is a time chart showing a wafer processing method according to the embodiment. Here, (a) of FIG. 7 shows presence or absence of the wafer W on the sample stage 103. (b) of FIG. 7 shows an output (power) of the high-frequency power supply 110 that supplies the high-frequency power for forming the plasma 1011 to the coil 108. (c) of FIG. 7 shows potentials of the electrodes 304 and 305. (d) of FIG. 7 shows a potential of a surface of the wafer W or the electrostatic adsorption film 302. (e) of FIG. 7 shows a potential difference between the electrode 304 and the wafer W or a potential difference between the electrode 305 and the wafer W.

The embodiment has a point of performing a waferless electricity-removal step of removing the charged particles remaining on the electrostatic adsorption film 302 before the wafer W is placed on the sample stage 103. The waferless electricity-removal step is performed in a so-called waferless state where there is no member covering an upper surface of the sample stage 103 on which the wafer is placed. As shown in (a) of FIG. 7, the waferless state continues from a time point Tp0 to a time point Tp2.

Further, since there is no wafer W in the waferless electricity-removal step, the potential differences between the wafer W and the electrode 304 and between the wafer W and the electrode 305 cannot be measured. Therefore, there is no potential shown in (e) of FIG. 7 that shows the potential difference in the electricity-removal step from Tp0 to Tp2. When the plasma 1011 is formed in the discharge chamber 102, the generated charged particles such as ions enter the processing chamber 104 and adhere to the surface of the electrostatic adsorption film 302 of the sample stage 103. Therefore, the potential in (d) of FIG. 7 from the time point Tp0 to the time point Tp2 indicates the potential of the electrostatic adsorption film 302.

<Waferless Electricity—Removal Step>

In the embodiment, the waferless electricity-removal step of removing the electric charges charged on the sample stage 103 without placing a wafer on the sample stage 103 is performed.

First, an electricity-removal plasma is generated in the waferless electricity-removal step according to the embodiment. Examples of an electricity-removal gas for generating the electricity-removal plasma (hereinafter, also referred to as a "first electricity-removal gas") include a gas such as $SF_6$ having reactivity with an adhesion substance and an inert gas such as Ar. A gas having little damage to the polyimide resin, which is a material constituting the electrostatic adsorption film 302, is selected as the electricity-removal gas. Such a gas includes a gas having a cleaning effect of removing the reaction product and the like adhering to the processing chamber 104 in addition to an electricity-removing effect.

First, at the time point Tp0, a plasma generation step of generating the plasma by using the first electricity-removal gas is performed. In the plasma generation step, the plasma is generated from the first electricity-removal gas by using the high-frequency power in the discharge chamber 102. At the time point Tp0, as shown in (b) of FIG. 7, the high-frequency power (hereinafter also referred to as "first high-frequency power") is supplied from the high-frequency power supply 110 to the coil 108. At a point of the time point Tp0, the first electricity-removal gas introduced in advance exists in the discharge chamber 102.

At the time point Tp0, a power supplying step of supplying first power to the electrodes 304 and 305 of the sample stage 103 is performed. As the supplied first power, 100 V is applied from the DC power supply 306 to the electrode 304, and −100 V is applied from the DC power supply 307 to the electrode 305.

Here, a flow of the charged particles generated from the plasma 1011 will be described with reference to FIG. 8. FIG. 8 is a view showing an electric circuit from the plasma to earth. Broken lines indicate the flow of the electric charges. The charged particles generated in the plasma 1011 reach the earth connected to the DC power supply 306 or 307 via the electrostatic adsorption film 302, the electrode 304 or 305, the push-up pins 313, and the base material 301. The electric charges generated in the plasma 1011 directly adhere to the push-up pins 313, reach the base material 301, and reach the earth connected to the DC power supply 306 or 307. In this way, it is assumed that the charged particles adhering to the electrostatic adsorption film 302 reach the earth. In this way, since a circuit in which the charged particles generated in the plasma 1011 are directed to the earth is formed, the charged particles adhering to the surface of the electrostatic adsorption film 302 are removed, and the potential of the surface of the electrostatic adsorption film 302 is about 0 V.

Thereafter, a step of supplying power for the electricity-removal step to the electrodes of the sample stage 103 is performed. At the time point Tp1, as shown in (b) of FIG. 7, the high-frequency power for generating the plasma 1011 is cut off, and the DC power supplied to the electrodes 304 and 305 is set to 0. The time point Tp1 indicates a time point at which the charged particles remaining in the processing chamber 104 disappear. Therefore, the time point Tp1 may be extended to a time point Tp2 obtained by delaying by a period t1 until afterglow discharge of the plasma 1011 disappears.

<Wafer Processing Step>

In the embodiment, after the waferless electricity-removal step, a wafer processing step of electrostatically adsorbing the wafer W placed on the sample stage 103 and processing the wafer W is performed. The wafer processing step includes an etching step of the wafer and an electricity-removal step during wafer placement. As will be described later, the wafer processing step includes a placement step, an electrostatic adsorption step, and a plasma etching step, and the electricity-removal step during wafer placement includes an electricity-removal plasma generation step and a potential difference reduction step.

First, the placement step of placing the wafer W on the sample stage 103 is performed. At the time point T0, as shown in (a) of FIG. 7, the wafer W is carried into the processing chamber 104 by the transfer mechanism such as the robot arm and placed on the sample stage 103.

Thereafter, at the time point T1, second power is supplied to the electrodes 304 and 305 of the sample stage 103 to perform the electrostatic adsorption step of electrostatically adsorbing the wafer W. As shown in (c) of FIG. 7, the voltages are applied to the electrodes 304 and 305, and the wafer W is electrostatically adsorbed onto the electrostatic adsorption film 302. As the supplied second power, the voltage applied to the electrode 304 and the voltage applied to the electrode 305 are adjusted to have different polarities and equal absolute values. As described above, for example, the voltage of −1500 V is applied to the electrode 304, and the voltage of 1500 V is applied to the electrode 305.

Next, the plasma etching step of supplying the gas for processing to the discharge chamber 102 and generating the plasma from the gas for processing by using second high-frequency power is performed. At the time point T2, as shown in (b) of FIG. 7, the second high-frequency power is supplied from the high-frequency power supply 110 to the coil 108. Accordingly, the etching plasma 1011 is generated from the gas for processing introduced into the discharge chamber 102. Particles such as radicals having reactivity and passing through the dispersion plate 106 react with the film layer, which is the processing target, on the surface of the wafer W, and plasma etching proceeds.

Here, as shown in (d) of FIG. 7, the charged particles such as ions adhere to the wafer W, and the wafer W is negatively charged. As shown in (e) of FIG. 7, the potential difference between the wafer W and the electrode 305 increases, and the potential difference between the wafer W and the electrode 304 decreases. When the wafer W is detached in a state where the potential difference is biased as described above, there is an electrostatic adsorption force due to the electric charges remaining between the wafer W and the electrostatic adsorption film 302, the detachment of the wafer W is hindered, and the positional deviation of the wafer W may occur.

To avoid such a positional deviation, in the embodiment, after the etching step is ended, the electricity-removal step during wafer placement is performed. The electricity-removal step during wafer placement is a step of supplying a second electricity-removal gas to the discharge chamber 102 and generating the plasma from the second electricity-removal gas by using third high-frequency power.

First, at a time point T3, as shown in (b) of FIG. 7, the high-frequency power supplied from the high-frequency power supply 110 to the coil 108 is changed to high-frequency power different from the second high-frequency power during the etching (hereinafter, referred to as the "third high-frequency power"). In addition, the gas introduced into the discharge chamber 102 is switched from the gas for processing to an electricity-removal gas having a small influence on the wafer W such as an inert gas (hereinafter, referred to as the "second electricity-removal gas"). In this way, in the discharge chamber 102, the electricity-removal plasma generation step of generating the electricity-removal plasma 1011 from the second electricity-removal gas by using the third high-frequency power is performed.

Next, at a time point T4, the potential difference reduction step of supplying the second power so that the electrode 304 and 305 of the sample stage 103 is equal to the potential of the wafer W. As shown in (c) of FIG. 7, the voltages applied to the electrodes 304 and 305 as the supplied second power is −ΔV equal to the potential of the wafer W. For example, the potential of the wafer W can be obtained in advance. Further, the potential of the wafer W may be measured after the electricity-removal plasma 1011 is generated after the time point T3. Accordingly, at a time point T4, as shown in (e) of FIG. 7, the potential difference between the wafer W and the electrode 304 and the potential difference between the wafer W and the electrode 305 are reduced, and the electrostatic adsorption force between the wafer W and the electrostatic adsorption film 302 is eliminated.

Thereafter, at a time point T5, as shown in (b) of FIG. 7, the supply of the high-frequency power for generating the plasma 1011 supplied from the high-frequency power supply 110 is stopped.

A time point T6 when a predetermined time t2 has elapsed from the time point T5 represents a time point at which the charged particles remaining in the processing chamber 104 disappear. Here, the predetermined time t2 may be a time until the afterglow discharge of the electricity-removal plasma 1011 disappears. During a period from the time point T5 to the time point T6, when a resistance value of the electrostatic adsorption film 302 is sufficiently large, as shown in (d) of FIG. 7, a value of −ΔV of the potential of the wafer W during the plasma processing for the electricity-removal starting from the time point T3 is maintained as it is.

As shown in (c) of FIG. 7, the potentials of the electrodes 304 and 305 are not changed from the time point T4. The potential difference between the wafer W and the electrode 304 and the potential difference between the wafer W and the electrode 305 are 0 V from the time point T4 as shown in (e) of FIG. 7, and the electrostatic adsorption force between the wafer W and the electrostatic adsorption film 302 is not generated. At the subsequent time point T6, as shown in (c) of FIG. 7, the voltages applied to the electrodes 304 and 305 are set to 0 V. At this time, the potentials of the electrodes 304 and 305 change, and the potential of the wafer W also changes according to the change in the potentials of the electrodes 304 and 305 and is about 0 V.

Therefore, as shown in (e) of FIG. 7, the potential difference between the wafer W and the electrode 304 and the potential difference between the wafer W and the electrode 305 are maintained at about 0 V even after the T6. That is, the potentials of the electrodes 304 and 305 can be set to 0 V in a state where an electrostatic adsorption force between the wafer W and the electrode 304 and an electrostatic adsorption force between the wafer W and the electrode 305 are eliminated. At a time point T7, the wafer W is detached from the sample stage 103 by the push-up pins 313 and carried out to an outside of the processing chamber 104.

(Functions and Effects)

By performing the waferless electricity-removal step described above, the electrostatic adsorption film 302 after the plasma processing can be electricity-removed, and the positional deviation when placing the wafer on the sample stage 103 and performing the electrostatic adsorption can be prevented. Further, by performing the predetermined electricity-removal step after the plasma processing, the positional deviation when the wafer W is detached from the sample stage 103 can be prevented. Further, by preventing the positional deviation of the wafer during the wafer processing, efficiency and yield in the wafer processing can be improved.

The first power, the second power, the first high-frequency power, the second high-frequency power, and the third high-frequency power may be appropriately set according to a manufacturing condition and a purpose of the processing. The first electricity-removal gas and the second electricity-removal gas may use the same type of gas and may use different types of gases. Further, a magnitude of a time point in the time chart may also be appropriately set.

(Modification)

When voltages are applied to the electrodes 304 and 305 during a step of processing of introducing the plasma 1011 formed in the discharge chamber 102 into the processing chamber 104, depending on a type of a gas introduced to form the plasma 1011, charged particles such as ions may be adsorbed to the electrostatic adsorption film 302 to damage the electrostatic adsorption film 302. For example, such a problem may occur when plasma cleaning for removing a reaction product is performed by using a plasma. To solve the problem, an electricity-removal step for reducing the damage will be described below.

FIG. 9 is a timing chart showing a plasma processing method according to a modification of the embodiment. (a) of FIG. 9 shows presence or absence of the wafer W on the sample stage 103. (b) of FIG. 9 shows an output (power) of the high-frequency power supply 110 that supplies high-frequency power for forming the plasma 1011 to the coil 108. (c) of FIG. 9 shows potentials of the electrodes 304 and 305 for electrostatic adsorption. (d) of FIG. 9 shows a potential of a surface of the wafer W or the electrostatic adsorption film 302. (e) of FIG. 9 shows a potential difference between the electrode 304 and the wafer W and a potential difference between the electrode 305 and the wafer W.

The modification is different from the embodiment in that an electricity-removal step after cleaning is performed. In particular, there are differences in (b) of FIG. 9, (c) of FIG. 9, and (d) of FIG. 9. In the following description, the same reference numerals are given to the same or equivalent components as those of the above-described embodiment, and description thereof will be simplified or omitted.

First, a step of cleaning the discharge chamber 102 and the processing chamber 104 is performed in a waferless state. At a time point Tc0, high-frequency power (hereinafter also referred to as "fourth high-frequency power") is supplied from the high-frequency power supply 110 to the coil 108. At a point of the time point Tc0, a cleaning gas is introduced into the discharge chamber 102. As the cleaning gas, for example, a gas having little damage to a polyimide resin such as $SF_6$ gas and Ar gas is selected. In this way, the plasma 1011 for performing the cleaning is generated.

The charged particles such as ions in the plasma 1011 enter the processing chamber 104 through the through holes 201 of the dispersion plate 106 and adhere to the electrostatic adsorption film 302 of the sample stage 103. Therefore, as shown in (d) of FIG. 9, a potential of the electrostatic adsorption film 302 is varied. When the wafer W to be processed is placed on the sample stage 103 in the state, a positional deviation of the wafer occurs due to a potential difference between the electrostatic adsorption film 302 and the wafer W as in the related art. Therefore, in the modification, the electricity-removal step after cleaning is performed.

The electricity-removal step after cleaning for reducing electric charges of the electrostatic adsorption film 302 will be described. First, at a time point Tc1, the electricity-removal plasma 1011 is generated. As shown in (b) of FIG. 9, the high-frequency power supplied from the high-frequency power supply 110 to the coil 108 is changed to high-frequency power different from the fourth high-frequency power during the cleaning (hereinafter, also referred to as "fifth high-frequency power"). The fifth high-frequency power is, for example, 1000 W. Further, the gas introduced into the discharge chamber 102 is switched from the cleaning gas to an electricity-removal gas such as an inert gas such as Ar gas (hereinafter, also referred to as a "third electricity-removal gas"). In this way, in the discharge chamber 102, an electricity-removal plasma generation treatment of generating the electricity-removal plasma 1011 from the third electricity-removal gas by using the fifth high-frequency power is performed.

At a time point Tc1, as shown in (c) of FIG. 9, a remaining electric charge removing step of supplying third power to the electrodes 304 and 305 of the sample stage 103 is performed. As the supplied third power, for example, a voltage of 100 V is applied from the DC power supply 306 to the electrode 304, and a voltage of –100 V is applied from the DC power supply 307 to the electrode 305. The voltages are smaller than a voltage applied when the wafer W is electrostatically adsorbed.

The time point at which the electricity-removal plasma is generated by changing the high-frequency power and the time point at which the voltages are applied to the electrodes 304 and 305 are not limited to the same time point. As shown in (b) of FIG. 9, the application of the voltages to the electrodes 304 and 305 may be started within a time $t_a$ between the time point Tc1 at which the electricity-removal plasma 1011 is formed and a time point Tc2. Further, after the voltages are applied to the electrodes 304 and 305, the electricity-removal plasma 1011 may be generated by changing the high-frequency power. In either case, a period during which the electricity-removal plasma 1011 is generated and a period during which the voltages are applied to the electrodes 304 and 305 need to overlap each other at least, and in the modification, the periods overlap each other for one second or more. In this way, an electric circuit is formed between the plasma 1011 and the electrostatic adsorption film 302 as shown in FIG. 8, charged particles on a surface of the electrostatic adsorption film 302 are removed, and the potential of the surface in the electrostatic adsorption film 302 is about 0 V.

Thereafter, at the time point Tc2, as shown in (b) of FIG. 9, the power supply from the high-frequency power supply 110 to the coil 108 is stopped. As shown in (c) of FIG. 9, the voltages applied to the electrodes 304 and 305 are set to 0 V. A period from the time point Tc1 to the time point Tc2 is a period during which the charged particles remaining in the processing chamber 104 are sufficiently removed as in the embodiment, and may be extended by a time $t_b$ until afterglow discharge of the electricity-removal plasma 1011 disappears.

At a time point Tc3 after elapsing of the time $t_b$, the electricity-removal step after cleaning is completed. Thereafter, the wafer W is transferred to the processing chamber 104, and a predetermined wafer processing step is performed. The wafer processing step is the same as that according to the embodiment.

(Functions and Effects)

By performing the electricity-removal step after cleaning as described above, the electric charges remaining on the electrostatic adsorption film 302 in a waferless cleaning step can be removed. Therefore, the positional deviation when the wafer W is attached to and detached from the sample stage 103 can be prevented. Such an electricity-removal step is not limited to being performed after the cleaning step. In plasma processing in a waferless state other than the cleaning, the electricity-removal step may also be applied to remove the electric charges remaining on the electrostatic adsorption film 302.

The fourth high-frequency power, the fifth high-frequency power, the third electricity-removal gas, and the third power may be appropriately set according to a manufacturing condition and a purpose of the processing as in the embodiment. Further, a magnitude of a time point in the time chart may also be appropriately set.

In addition, the inventors conducted experiments and studied a correlation between the voltages applied to the electrodes 304 and 305, an application time of the voltage, and an effect of the electricity-removal in the electricity-removal step of reducing the electric charges of the electrostatic adsorption film 302. As a result of an experiment that was performed with setting power of the high-frequency power supply 110 to 1000 W and setting the voltages applied to the electrodes 304 and 305 to values in a range of ±100

V to ±500 V, it was confirmed that the electrostatic adsorption film 302 is sufficiently electricity-removed and the positional deviation when the wafer W is attached to and detached from the sample stage 103 is prevented. When the voltages applied to the electrodes 304 and 305 were ±100 V or more, it was confirmed that the positional deviation is prevented by generating the electricity-removal plasma 1011 for one second or more and performing the electricity-removal step.

Further, in the embodiment and the modification described above, the polarities of the voltages applied to the electrodes 304 and 305 are different from each other, and the same operation of electricity-removal may also be achieved by setting the voltages to have the same polarity. At this time, to obtain a sufficient electricity-removal effect, the output of the high-frequency power supply 110 may be changed, and the electrostatic adsorption film 302 formed of another material having a high insulation property may be used. Further, according to the change, values of the voltages applied to the electrodes 304 and 305 and a time of the step can be appropriately changed.

Although, in the embodiment and the modification described above, the inductively coupled plasma 1011 is formed, the invention can be applied regardless of a plasma generation method. For example, the invention can be applied to a helicon wave plasma processing apparatus, an ECR plasma processing apparatus using microwaves, a capacitively coupled plasma processing apparatus, and the like.

REFERENCE SIGNS LIST

100: plasma processing apparatus
101: vacuum container
102: discharge chamber
103: sample stage
104: processing chamber
105: IR lamp unit
106: dispersion plate
107: dielectric chamber
108: coil
109: matching device
110: high-frequency power supply
201: through hole
301, 301*a*: base material
302, 302*a*: electrostatic adsorption film
303: coolant flow path
304, 305: electrode
306, 307: DC power supply
308: groove
309: valve
310: heat transfer gas source
311: susceptor ring
312: chiller
313: push-up pins
1011: plasma
1012: top plate
10121: gas dispersion plate
1014: mass flow controller
1015: vacuum pump
1016: pressure control valve

1017: IR lamp
1018: reflection plate
1019: IR light transmission window

The invention claimed is:

1. A wafer processing method in a processing apparatus including a processing chamber in which a wafer to be processed is located, a sample stage arranged inside the processing chamber and having an electrode configured to electrostatically adsorb the wafer, and a dispersion plate arranged above the sample stage opposite to an upper surface of the sample stage and having a plurality of through-holes through which electrically-charged particles of gas for processing the wafer flow into the processing chamber, wherein the plurality of through-holes are arranged in a ring-shaped region of the dispersion plate in an outer peripheral region thereof, the method comprising:

a waferless electricity-removal step of removing an electric charge charged on the sample stage without placing a wafer on the sample stage by supplying the electrically-charged particles through the through-holes of the dispersion plate into the processing chamber; and a wafer processing step of electrostatically adsorbing the wafer placed on the sample stage and processing the wafer after the waferless electricity-removal step.

2. The wafer processing method according to claim 1, wherein the waferless electricity-removal step includes:

a plasma generation step of generating a plasma by using a first electricity-removal gas; and a power supplying step of supplying first power to the electrode of the sample stage.

3. The wafer processing method according to claim 2, wherein in the plasma generation step, the plasma is generated from the first electricity-removal gas by using first high-frequency power.

4. The wafer processing method according to claim 3, wherein the wafer processing step includes an etching step and an electricity-removal step during wafer placement, the etching step includes:

a placement step of placing the wafer on the sample stage;

an electrostatic adsorption step of electrostatically adsorbing the wafer by supplying second power to the electrode of the sample stage; and a plasma etching step of generating a plasma from a gas for processing by using second high-frequency power, and the electricity-removal step during wafer placement includes:

an electricity-removal plasma generation step of generating a plasma from a second electricity-removal gas by using third high-frequency power; and a potential difference reduction step of supplying the second power to the electrode such that the electrode of the sample stage has a potential equal to a potential of the wafer.

5. The wafer processing method according to claim 2, wherein the first electricity-removal gas contains an inert gas.

* * * * *